United States Patent
Keser et al.

(10) Patent No.: US 6,458,622 B1
(45) Date of Patent: Oct. 1, 2002

(54) STRESS COMPENSATION COMPOSITION AND SEMICONDUCTOR COMPONENT FORMED USING THE STRESS COMPENSATION COMPOSITION

(75) Inventors: Lizabeth Ann Keser; Treliant Fang, both of Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/348,737

(22) Filed: Jul. 6, 1999

(51) Int. Cl.[7] ............................................. H01L 21/44

(52) U.S. Cl. ...................... 438/106; 438/117

(58) Field of Search .................. 438/119, 106–108, 438/117–127

(56) References Cited

U.S. PATENT DOCUMENTS 6,020,220 A  *  2/2000  Gilleo et al. ................. 438/119

* cited by examiner

Primary Examiner—Roy Potter
(74) Attorney, Agent, or Firm—Kim-Marie Vo

(57) ABSTRACT

A semiconductor component (10) having a photodefinable stress compensation layer (21) and composition for the stress compensation material. The photodefinable stress compensation material is formed on a semiconductor wafer (11) and openings (22) are made photolithographically. Conductive bumps (26) are then disposed thereon and additional conductive bumps (28) are formed on the original conductive bumps (26). The photodefinable stress compensation material is composed of a photoinitiator, an epoxy having a first index of refraction, a diluent, and a filler. The indices of refraction of the epoxy-diluent combination and the filler are approximately equal. Alternatively, the photodefinable stress compensation material can be formed on a semiconductor wafer (11) having conductive bumps (46) disposed thereon. Openings (49) are formed in the stress compensation layer (47) to expose the conductive bumps (46). Additional conductive bumps (51) are formed on the original conductive bumps (46).

8 Claims, 6 Drawing Sheets

STRESS COMPENSATION COMPOSITION AND SEMICONDUCTOR COMPONENT FORMED USING THE STRESS COMPENSATION COMPOSITION

BACKGROUND OF THE INVENTION

The present invention relates, in general, to semiconductor components and, more particularly, to stress relief in the semiconductor components.

Semiconductor manufacturers often form conductive bumps on semiconductor chips to electrically contact substrates such as printed circuit boards, Tape Automated Bonding (TAB) substrates, leadframes, etc. Advantages of using conductive bumps include: the ability to perform wafer level packaging, increased Input and Output (I/O) density, which results in a smaller device "footprint," increased signal propagation speed due to shorter interconnections, reduced vertical profile, and lower device weight.

Typically, the conductive bumps are formed by depositing a layer of masking or stencil material over the substrate, forming openings in the solder mask, disposing a conductive paste in the openings, and reflowing the conductive paste to form the conductive bumps. The semiconductor wafer containing the conductive bumps is then mounted to a support substrate such as a printed circuit board. To prevent damage from mechanical stresses, a stress compensation layer is formed on the semiconductor wafer. In one approach, the stress compensation layer is formed using a resin transfer molding process to encapsulate the surface of the semiconductor wafer. Disadvantages of this technique include air bubble entrapment in the resin and compression of the semiconductor wafer. Another approach incorporates a redistribution dielectric over the surface of the wafer. A disadvantage of this technique is that large bumps must be formed in order to increase the reliability of the package. This results in a low density I/O count due to the large diameter of the conductive bumps.

Accordingly, it would be advantageous to have a semiconductor component that has a photoimageable stress compensation layer. It would be of further advantage for the stress compensation layer to have a Coefficient of Thermal Expansion (CTE) that matches that of solder joints present on the semiconductor component.

BRIEF DESCRIPTION OF THE DRAWINGS

For simplicity and clarity of illustration, elements in the drawings are not necessarily drawn to scale, and the same reference numerals in different figures denote the same elements.

DETAILED DESCRIPTION OF THE DRAWINGS

Figure 1:
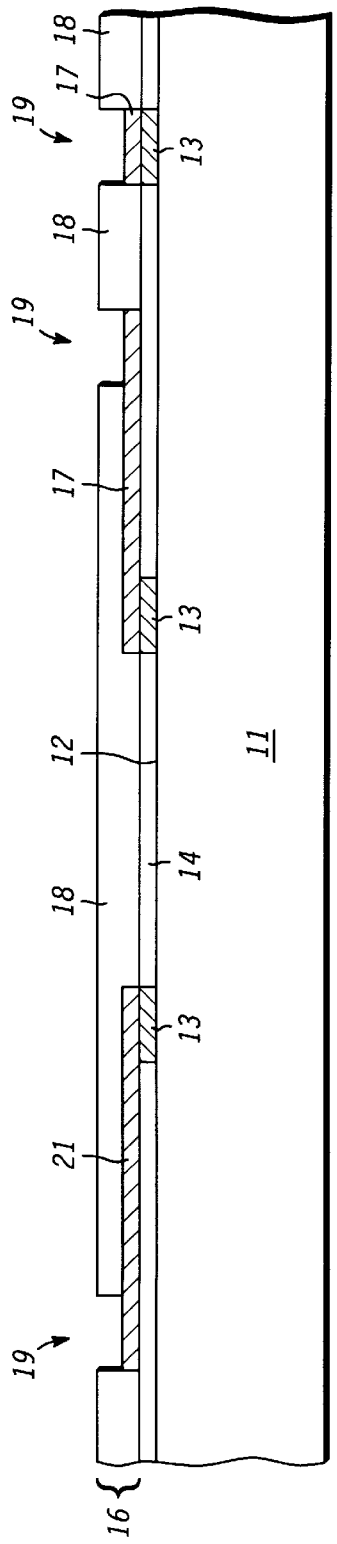
FIG. 1 is a highly enlarged cross-sectional view of a semiconductor component at an early stage of manufacture in accordance with an embodiment of the present invention.

Generally, the present invention provides a semiconductor component having a photosensitive stress compensation layer, a method of manufacturing the semiconductor component, and a composition of the photosensitive stress compensation material. The photosensitive stress compensation material enables formation of conductive bumps having bump heights up to 400 micrometers ($\mu$m) without increasing process complexity or the bondpad footprint. The stress compensation material of the present invention is sensitive to light, therefore, openings or vias can be formed in the material using photoimageable techniques. Because the material is photosensitive, it is also referred to as being photodefinable. In addition to this property, the photosensitive stress compensation material has a Coefficient of Thermal Expansion (CTE) that matches that of the solder joints formed between the substrate and an underbump material or a bond pad.

One aspect of the present invention is the composition of the photodefinable stress compensation layer. It should be understood that the properties of the stress compensation material are influenced by those of the epoxy; therefore, it is desirable for the epoxy to have a CTE that is close to that of the solder joints, a glass transition temperature that ensures dimensional stability during reliability testing, an elastic modulus that will not contribute to large stresses during thermal cycling, an elongation at break that is greater than 1 percent, and a low moisture absorption. However, these properties are not present in a single epoxy. Therefore, an epoxy formulation comprising a mixture of epoxies and filler has been invented to produce the photodefinable-stress compensation material. By way of example, the photodefineable stress compensating material comprises a filled epoxy.

In accordance with one embodiment of the present invention, a photodefinable stress compensation material is formed by combining an epoxy, a diluent, a filler, and a photoinitiator. Preferably, the epoxy is an aromatic epoxy having properties that can be tailored or adjusted to produce a suitable stress compensation composition. By way of example, the aromatic epoxy is bisphenol F diepoxide. Another suitable aromatic epoxy is bisphenol A diepoxide. Bisphenol F diepoxide polymer has a CTE of approximately 58 parts per million per degree Celsius (ppm/°C.), a viscosity of approximately 50 kiloCentipoise, KCp, a glass transition temperature of approximately 135° C., and an index of refraction of approximately 1.58. The CTE of bisphenol F diepoxide is higher than that of the solder joints; therefore, a filler is added to the bisphenol F diepoxide to create an epoxy composition having a CTE on the order of 30–45 ppm/°C.. A suitable filler is borosilicate glass because it has an index of refraction in the range of 1.52 to 1.54. However, the index of refraction of the filler is lower than that of the epoxy, which has an index of refraction of approximately 1.58. Other suitable filler materials include quartz, silica, spherical glass beads, or the like.

To match the indices of refraction between the epoxy composition and the filler, a diluent such as an aliphatic epoxy having a lower index of refraction than that of the aromatic epoxy is combined with the aromatic epoxy to form an epoxy composition. A suitable class of aliphatic epoxies that can be combined with bisphenol F diepoxide are the cycloaliphatic epoxies. Examples of aliphatic epoxies include diglycidyl-1,2-cyclohexanedicarboxylate, limonene oxide, and 3,4-epoxycyclohexylmethyl 3,4-epoxycyclohexane carboxylate. It should be noted that because the aliphatic epoxies have a lower viscosity than the viscosity of the bisphenol F diepoxide, the viscosity of the epoxy composition is lower than that of the bisphenol F diepoxide. It should be further noted that because cured aliphatic epoxies exhibit poor moisture resistance and are brittle, the amount of aliphatic epoxies should be adjusted to ensure these parameters do not adversely affect the epoxy composition.

The photoinitiator initiates polymerization of the epoxy composition upon exposure to radiation such as light. The photoinitiator can be either a cationic photoinitiator or a free-radical photoinitiator. In the presence of Ultra-Violet (UV) light, the cationic photoinitiator generates a strong acid that initiates polymerization of the epoxy. In other words, the strong acid promotes cross-linking of the epoxy constituents. The free-radical photoinitiators initiate polymerization of epoxy acrylates by attacking the acrylate portion of the epoxy acrylate.

In accordance with one embodiment, the photoinitiator is a cationic photoinitiator that is a mixture of an onium salt such as, for example, triaryl sulfonium hexafluorophosphate salt and a solvent such as, for example, propylene carbonate. A suitable triaryl sulfonium hexafluorophosphate salt is a combination of Bis-p-diphenylsulfoniumphenylsulfide hexafluorophosphate and diphenylphenylthiophenylsulfonium hexafluorophosphate. By way of example, the cationic photoinitiator is comprised of 50 weight percent of the onium salt and 50 weight percent of the solvent.

The cationic photocrosslinking of the epoxy is a result of UV radiation reacting with the cationic photoinitiator to form a strong acid. The strong acid opens the ring of the epoxy monomer to form a reactive cationic species, resulting in polymerization of the epoxy.

In another example of a cationic photoinitiator embodiment, the photodefinable stress compensation material is formed by combining an epoxy, a diluent, an epoxy acrylate, a cross-linker, a filler, and a cationic photoinitiator. The epoxy acrylate enhances the photoimageability of the photodefinable stress compensation layer and is formed by mixing epoxy acrylate monomers with a cross-linker such as, for example, triacrylate. More particularly, the photodefinable stress compensation material is comprised of approximately 15 weight percent aromatic epoxy, approximately 32.6 weight percent diluent or cycloaliphatic epoxy, approximately 47.5 weight percent of an epoxy acrylate and triacrylate mixture, and approximately 4.7 weight percent cationic photoinitiator. Preferably, the epoxy is bisphenol F diepoxide, sold under the tradename GY 281 by the Ciba Geigy Corporation; the cycloaliphatic epoxy is 3,4-epoxycyclohexylmethyl 3,4-epoxycyclohexane carboxylate sold under the tradename ERL 4221 by the Union Carbide Corporation; a mixture of epoxy acrylate and triacrylate that is 70 weight percent acrylated bisphenol F and 30 weight percent trimethylolpropanetriacrylate sold under the tradename Ebecryl 9636 by the UCB Chemical corporation; the filler is a borosilicate glass; and the cationic photoinitiator is 50 weight percent of a triaryl sulfonium hexafluorophosphate salt and 50 weight percent of 1,2 propylene carbonate sold under the tradename Uvacure 1590 by the UCB chemical corporation. In particular, the triaryl sulfonium hexafluorophosphate salt is a combination of Bis-p-diphenylsulfoniumphenylsulfide hexafluorophosphate and diphenylphenylthiophenylsulfonium hexafluorophosphate. It should be understood that the epoxy formulation can contain from 30 to 80 weight percent filler.

In yet another example of a cationic photoinitiator, the photodefinable stress compensation material is formed by combining a diluent, a filler, and a cationic photoinitiator, wherein the filler is either quartz or silica.

In accordance with a free radical photoinitiator embodiment, the photodefinable stress compensation material is formed by combining an epoxy, an epoxy acrylate, a diluent, a filler, and a free radical photoinitiator. In accordance with the free radical photoinitiator embodiment, the free radical photoinitiator is a mixture of an initiator and an amine synergist. By way of example, the initiator is isopropylthioxanthone and the amine synergist ethyl p-(dimethylamino)benzoate. A suitable mixture includes a 1:1 weight/weight mixture of isopropylthioxanthone and ethyl p-(dimethylamino)benzoate. For example, the mixture may be comprised of approximately 50 weight percent isopropylthioxanthone and 50 weight percent ethyl p-(dimethylamino)benzoate.

Preferably, the epoxy is an aromatic epoxy having properties that can be tailored or adjusted to produce a suitable stress compensation composition. By way of example, the aromatic epoxy is bisphenol F diepoxide and the epoxy acrylate is Ebecryl 9636. Another suitable aromatic epoxy is bisphenol A diepoxide.

To match the indices of refraction between the epoxy composition and the filler, an aliphatic epoxy having a lower index of refraction than that of the aromatic epoxy is combined with the aromatic epoxy to form an epoxy composition. A suitable class of aliphatic epoxies that can be combined with bisphenol F diepoxide are the cycloaliphatic epoxies.

The photocrosslinking of the acrylate is a result of UV radiation reacting with the free radical photoinitiator to generate free radicals by amine abstraction. The free radicals then react with acrylates to form a network that makes the epoxy less soluble (photointercalation).

Another aspect of the present invention is the use of the stress compensation composition in the formation of conductive bumps. FIG. 1 is a highly enlarged cross-sectional view of a semiconductor component 10 at an early stage of manufacture in accordance with another embodiment of the present invention. What is shown in FIG. 1 is a substrate 11 such as, for example, a semiconductor wafer having a surface 12. A layer 14 of dielectric material is formed on surface 12 and openings are formed in dielectric layer 14 at locations where bond pads 13 will be formed. As those skilled in the art are aware, semiconductor wafers are comprised of a plurality of semiconductor chips that contain circuit elements such as transistors, diodes, integrated circuits, passive elements, etc. Bond pads 13 make electrical contact to the appropriate regions of the integrated circuit or semiconductor device. It should be noted that the circuit elements are not shown in FIG. 1.

Bond pads 13 are formed on the portions of surface 12 exposed by the openings in dielectric layer 14. A redistribution structure 16 is formed on bond pads 13 and portions of dielectric layer 14. In accordance with the embodiment shown in FIG. 1, redistribution structure 16 is comprised of a layer 17 of electrically conductive material having a layer 18 of dielectric material disposed thereon. Suitable materials for electrically conductive layer 17 include copper, aluminum, or the like. Suitable materials for dielectric layer 18 include polyimide, benzocyclobutene (BCB) or the like. Redistribution structure 16 redistributes bond pads from a fine pitch peripheral configuration to a coarser pitch area array configuration. Thus, redistribution structure 16 serves to provide bond pad extensions. Although redistribution structure 16 is shown and described as an electrically conductive layer 17 disposed on an electrically insulating material 18, it should be understood this is not a limitation of the present invention. For example, redistribution structure 16 can be comprised of a plurality of electrically conductive layers separated by a plurality of electrically insulating or nonconductive layers.

A plurality of vias 19 are formed in electrically insulating layer 18 to expose bumping regions of electrically conductive layer 17. Bump or bumping regions of electrically conductive layer 17 are those regions over which conductive bumps will be formed.

Figure 2:
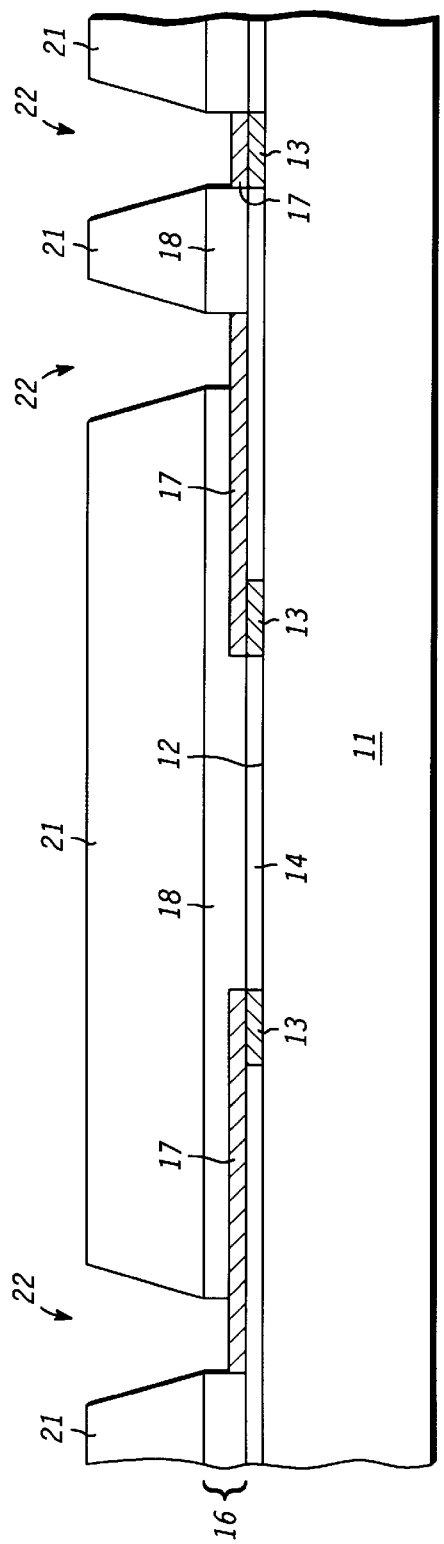
FIG. 2 is a highly enlarged cross-sectional view of the semiconductor component of FIG. 1 having a stress compensation layer formed thereon.

Now referring to FIG. 2, a layer 21 of the photodefinable stress compensation material as described hereinbefore is disposed on redistribution structure 16. Stress compensation layer 21 fills vias 19. Using photolithographic techniques, openings 22 are formed in stress compensation layer 17 to expose the bump regions of electrically conductive layer 17.

Figure 3:
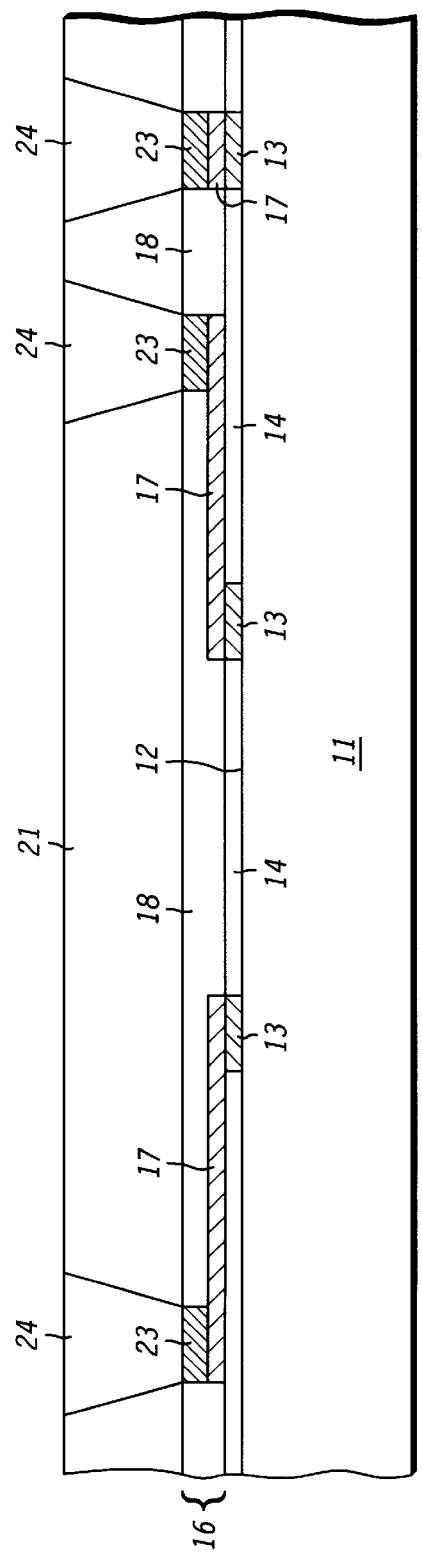
FIG. 3 is a highly enlarged cross-sectional view of the semiconductor wafer of FIG. 2 at a later stage of manufacture.

Now referring to FIG. 3, an optional underbump metallization layer 23 is formed on the exposed portions of electrically conductive layer 17, i.e., on the exposed bond pad regions of electrically conductive layer 17.

A conductive paste 24, such as for example, a solder paste, is disposed on stress compensation layer 21. Preferably, conductive paste 24 is dispensed, spread, or flooded on the surface and in openings 22 of stress compensation layer 21. A squeegee or other suitable instrument is used to sweep conductive paste 24 across stress compensation layer 21 and to substantially fill openings 22 in stress compensation layer 21. Excess conductive paste is removed from the surface of stress compensation layer 21.

Figure 4:
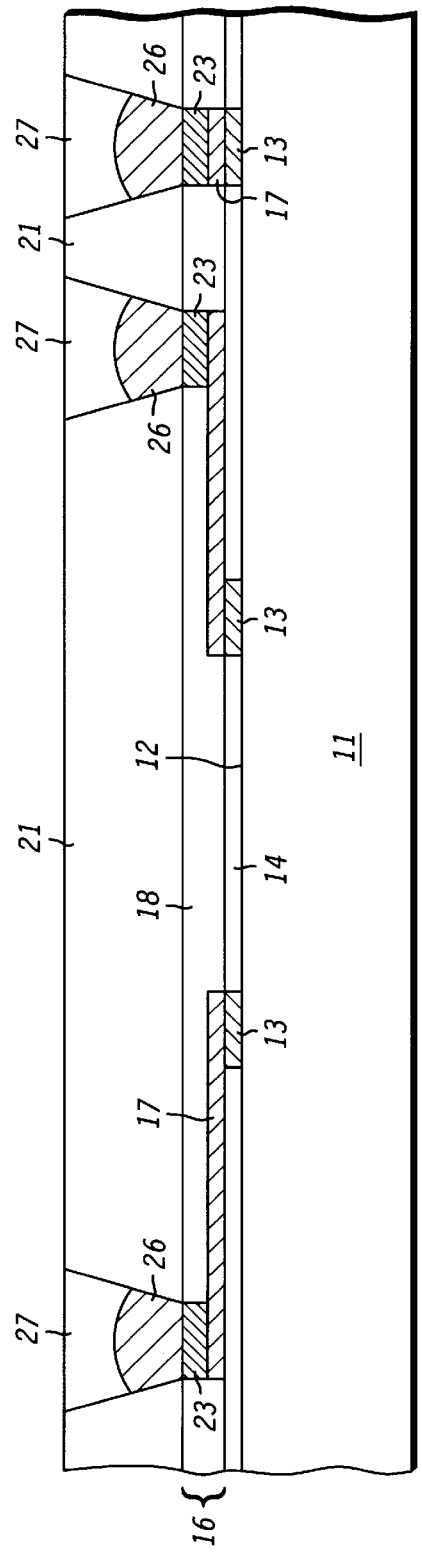
FIG. 4 is a highly enlarged cross-sectional view of the semiconductor wafer of FIG. 3 at a later stage of manufacture.

Now referring to FIG. 4, conductive paste 24 is reflowed to form conductive bumps 26. Conductive bumps 26 are also referred to as solder bumps when conductive paste 24 is a solder paste. Additional conductive paste 27 is disposed on stress compensation layer 21 and on conductive bumps 26. The purpose of applying the additional conductive paste is to increase the height of the conductive bumps. Alternatively, solder balls are disposed on conductive bumps 26.

Figure 5:
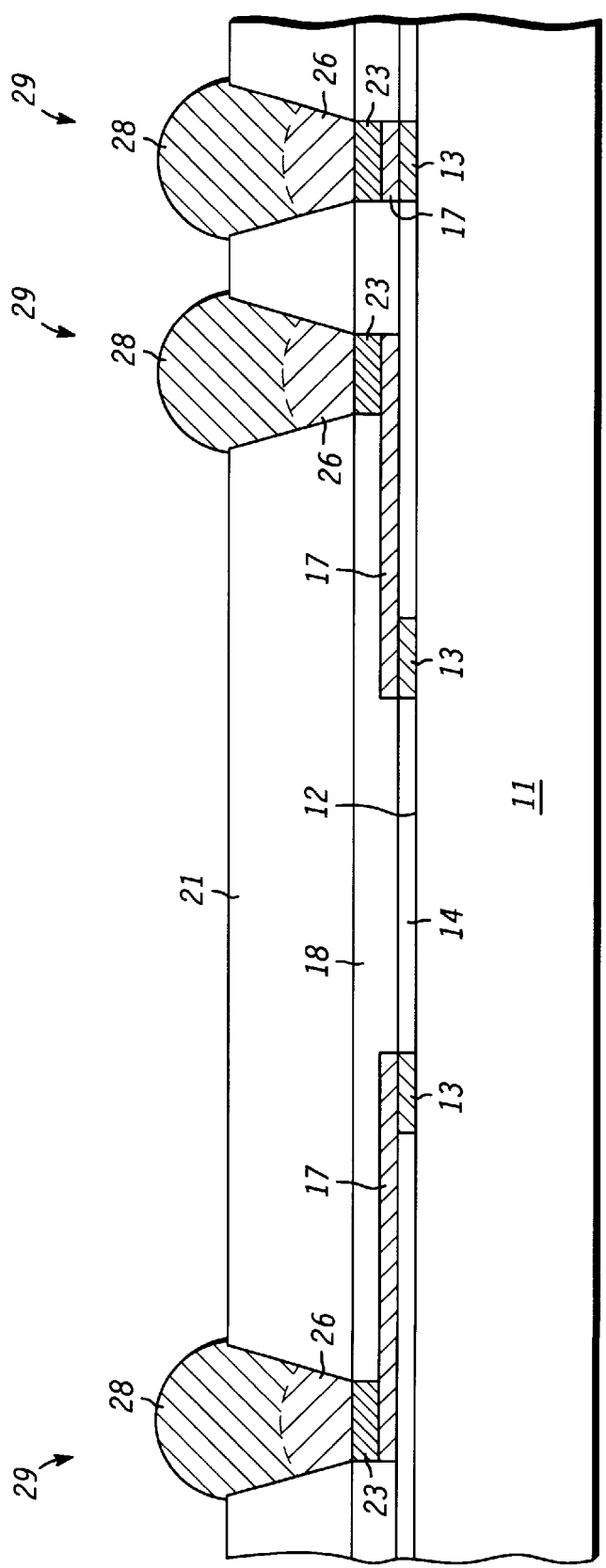
FIG. 5 is a highly enlarged cross-sectional view of the semiconductor wafer of FIG. 4 at a later stage of manufacture.

Now referring to FIG. 5, the conductive paste is reflowed to form conductive bumps 28 on conductive bumps 26. Conductive bumps 28 fuse with conductive bumps 26 to form conductive bumps 29. In this embodiment, stress compensation layer 21 not only serves to relieve the stress on the wafer, but it also acts as the stencil for the formation of conductive bumps 28.

Figure 6:
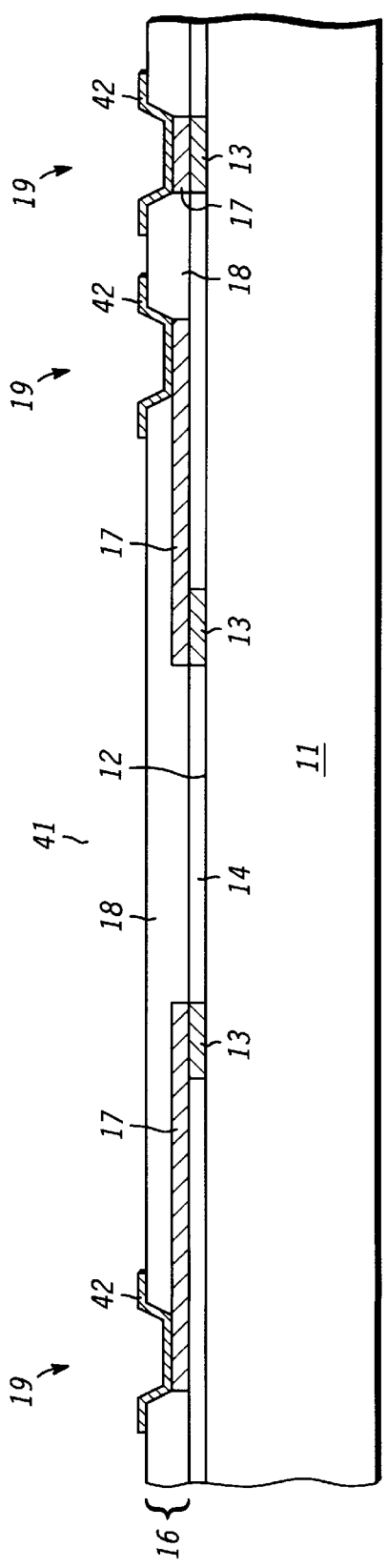
FIG. 6 is a highly enlarged cross-sectional view of a semiconductor component at an early stage of manufacture in accordance with another embodiment of the present invention.

FIG. 6 is a highly enlarged cross-sectional view of a semiconductor component 40 at an early stage of manufacture in accordance with yet another embodiment of the present invention. It should be understood the same reference numerals are used in the figures to denote the same elements. What is shown in FIG. 6 is a substrate 11 such as, for example, a semiconductor wafer having a surface 12 and bond pads 13 and dielectric layer 14 on surface 12. A redistribution structure 16 is formed on bond pads 13 and portions of dielectric layer 14. In accordance with this embodiment, redistribution structure 16 is comprised of a layer 17 of electrically conductive material having a layer of 18 of electrically nonconductive material disposed thereon. A plurality of vias 19 are formed in electrically nonconductive layer 18 to expose portions of electrically conductive layer 17. An optional underbump metallization layer 42 is formed on the exposed portions of electrically conductive layer 17.

Figure 7:
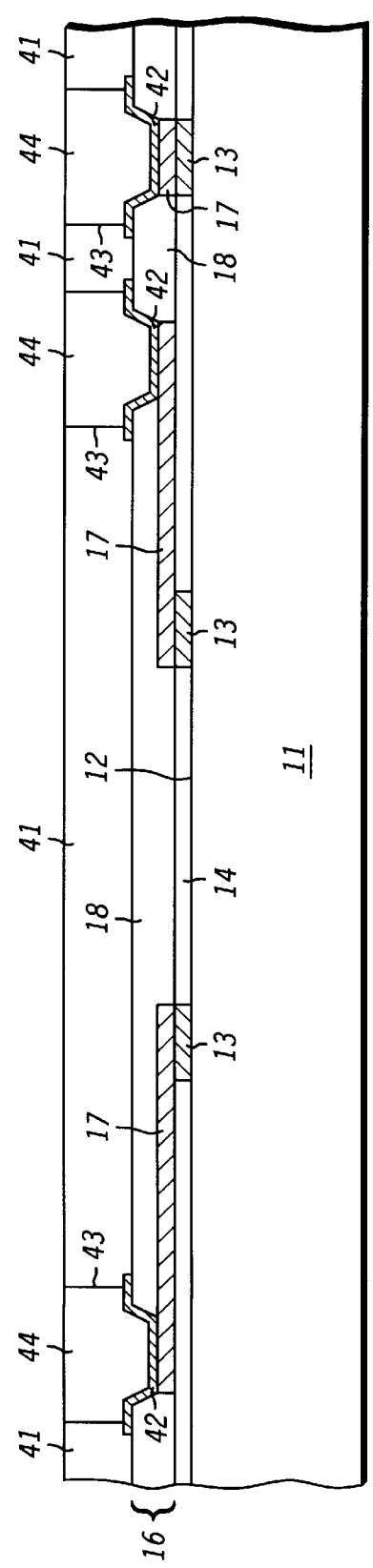
FIG. 7 is a highly enlarged cross-sectional view of the semiconductor wafer of FIG. 6 at a later stage of manufacture.

Now referring to FIG. 7, a layer 41 of solder mask material is formed on redistribution structure 16 and underbump metallization layer 42. Solder mask layer 41 is patterned so that openings 43 are formed in solder mask layer 41 to expose portions of underbump metallization layer 42. It should be understood that solder mask layer 41 serves as a stencil and that the material used for the stencil is a not a limitation of the present invention. For example, the stencil can be photoresist, stress compensation material, or the like. A conductive paste 44 such as, for example, a solder paste, is disposed on solder mask layer 41 and into openings 43. Techniques for disposing a conductive paste have been described with reference to FIG. 3. Excess conductive paste is removed from the surface of solder mask layer 41.

Figure 8:
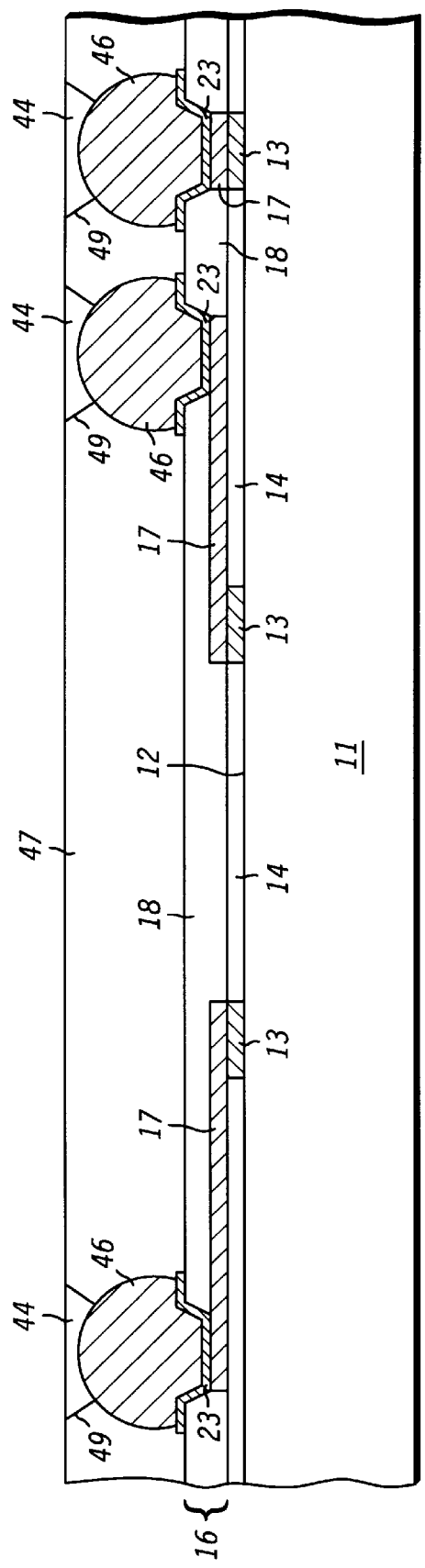
FIG. 8 is a highly enlarged cross-sectional view of the semiconductor wafer of FIG. 7 at a later stage of manufacture.

Now referring to FIG. 8, solder mask layer 41 is removed and the conductive paste reflowed to form conductive bumps 46. When conductive paste 44 is a solder paste, conductive bumps 46 are referred to as solder bumps. Conductive bumps 46 are cleaned and a layer 47 of a photodefinable stress compensation material is disposed on conductive bumps 46 and redistribution structure 16. Using photolithographic techniques, openings 49 are formed in stress compensation layer 47.

Figure 9:
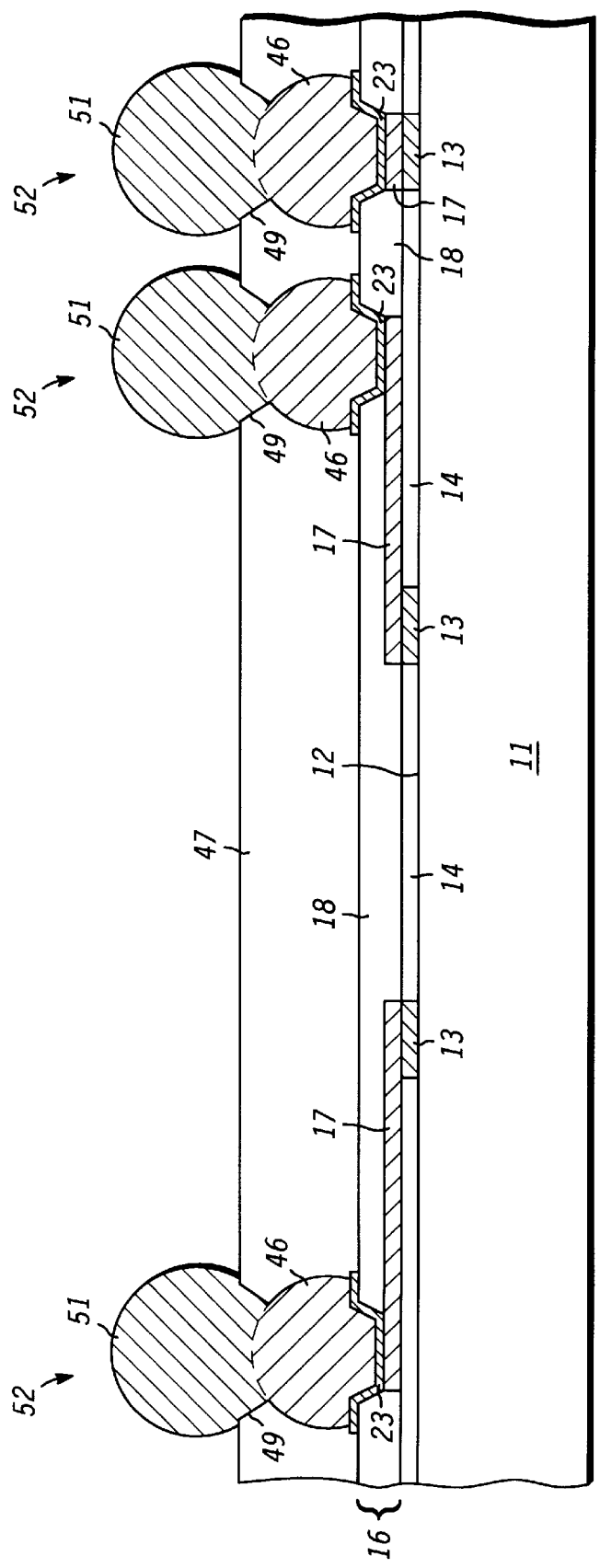
FIG. 9 is a highly enlarged cross-sectional view of the semiconductor wafer of FIG. 8 at a later stage of manufacture.

Now referring to FIG. 9, a second set of conductive bumps 51 are formed on conductive bumps 46. Conductive bumps 51 fuse with conductive bumps 46 to form bump structures 52. It should be understood that bumps having a total height of greater than approximately 300 microns can be formed using this invention. Alternatively, solder balls are disposed on conductive bumps 46.

By now it should be appreciated that a semiconductor component having a photodefinable stress compensation layer and a chemical composition for the stress compensation layer have been provided. The photodefinable stress compensation layer includes an epoxy formulation whose index of refraction is matched to the index of refraction of the filler. This matching of indices of refraction allows the stress compensation layer to be photoimageable to a thickness that is not possible for unmatched formulations such that portions of the stress compensation layer exposed to radiation such as UV light polymerize, whereas those portions not exposed to light can be easily removed. Therefore, thick epoxy films, i.e., films up to 200 μm thick, can be formed and vias can be formed in these thick films.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, the conductive bumps 16 can be formed on printed wire boards, flex circuits, metallized ceramic or glass, or the like. Further, the conductive bumps can be formed using a combination of solder powder and solid solder flux.

What is claimed is:

1. A method for forming a photodefinable stress compensation composition, comprising the steps of:

combining a photoinitiator with a diluent to form a first mixture;

combining the first mixture with an epoxy to form a second mixture; and combining the second mixture with a filler to form the photodefinable stress compensation composition.

2. The method of claim 1, wherein the step of combining the first mixture with the epoxy further includes combining an epoxyacrylate and a multifunctional acrylate with the first mixture and the epoxy.

3. The method of claim 2, wherein:

the photoinitiator is a cationic photoinitiator comprising about 50 weight percent of triaryl sulfonium hexafluorophosphate salt and about 50 weight percent of 1,2 propylene carbonate;

the diluent is selected from the group of diluents consisting of gamma butyrolactone and propylene carbonate, the epoxy comprises bisphenol F diepoxide;

the epoxyacrylate comprises about 70 weight percent acrylated-bisphenol F and about 30 weight percent trimethylolpropanetriacrylate; and the filler comprises a spherical glass bead filler.

4. A method of forming conductive bumps, comprising the steps of:

providing a substrate having a major surface and a bond pad disposed on the major surface and a first conductive bump formed on the bond pad;

forming a stress compensation layer over the major surface and the first conductive bump;

exposing the first conductive bump; and forming a second conductive bump, the second conductive bump over the first conductive bump.

5. The method of claim 4, wherein step of forming the stress compensation layer includes disposing a mixture of a photoinitiator, an epoxy having a first index of refraction, a diluent having a second index of refraction, wherein the first index of refraction cooperates with the second index of refraction to produce a third index of refraction and a filler having substantially the third index of refraction.

6. A method of forming conductive bumps, comprising the steps of:

providing a substrate having a major surface and a bond pad disposed on the major surface;

forming a stress compensation layer over the major surface and the bond pad;

exposing the bond pad; and forming a first conductive bump over the bond pad.

7. The method of claim 6, wherein the step of forming the stress compensation layer includes disposing a mixture of a photoinitiator, an epoxy having a first index of refraction, a diluent having a second index of refraction, wherein the first index of refraction cooperates with the second index of refraction to produce a third index of refraction and a filler having substantially the third index of refraction.

8. The method of claim 6, further including the step of forming a second conductive bump over the first conductive bump.

* * * * *